United States Patent
Sudou et al.

(10) Patent No.: US 6,903,566 B2
(45) Date of Patent: Jun. 7, 2005

(54) SEMICONDUCTOR DEVICE TESTER

(75) Inventors: Satoshi Sudou, Tokyo (JP); Naoyoshi Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/493,849

(22) PCT Filed: Nov. 8, 2002

(86) PCT No.: PCT/JP02/11660
§ 371 (c)(1),
(2), (4) Date: Apr. 27, 2004

(87) PCT Pub. No.: WO03/040739
PCT Pub. Date: May 15, 2003

(65) Prior Publication Data
US 2004/0251924 A1 Dec. 16, 2004

(30) Foreign Application Priority Data
Nov. 9, 2001 (JP) ........................................ 2001-344911

(51) Int. Cl.[7] .................... G01R 31/26; G01R 31/00
(52) U.S. Cl. .................... 324/765; 714/724; 702/118
(58) Field of Search ........................... 324/73.1, 763, 324/765, 158.1; 714/700, 718, 724, 731, 736, 738; 365/201; 702/108, 118–119, 124–126

(56) References Cited

U.S. PATENT DOCUMENTS

| | | | | |
|---|---|---|---|---|
| 4,928,278 A | * | 5/1990 | Otsuji et al. ................. | 714/700 |
| 5,406,132 A | * | 4/1995 | Housako ...................... | 714/740 |
| 5,432,797 A | * | 7/1995 | Takano ........................ | 714/718 |
| 5,461,310 A | * | 10/1995 | Cheung et al. ........... | 324/158.1 |
| 5,550,838 A | | 8/1996 | Okajima et al. ............. | 714/719 |
| 6,016,565 A | * | 1/2000 | Miura ......................... | 714/736 |
| 6,163,159 A | * | 12/2000 | Seyama ...................... | 324/751 |
| 6,523,143 B1 | * | 2/2003 | Kobayashi .................. | 714/718 |
| 6,631,486 B1 | * | 10/2003 | Komatsu et al. ............ | 714/724 |
| 6,753,693 B2 | * | 6/2004 | Seo et al. .................... | 324/765 |

FOREIGN PATENT DOCUMENTS

| | | |
|---|---|---|
| JP | 03238373 | 10/1991 |
| JP | 02083499 | 3/2002 |

* cited by examiner

*Primary Examiner*—Vinh Nguyen
*Assistant Examiner*—Jermele Hollington
(74) *Attorney, Agent, or Firm*—David N. Lathrop, Esq.; Gallagher & Lathrop

(57) ABSTRACT

In a semiconductor device testing apparatus for testing a plurality of semiconductor devices at one time, data peculiar to each semiconductor device can be written therein simultaneously with the avoidance of excessive enlargement in the scale of circuitry. A pair of an integer delay generation part and a fraction delay data generation part that are components of the semiconductor device testing apparatus is provided by the same number as that of pins of each semiconductor device under test, and a waveform control part is provided by the same number as that of the semiconductor devices under test for each of the pairs. In each waveform control part are generated a set pulse and a reset pulse for generating a test pattern signal to be applied to each of pins having the same attribute of the semiconductor devices under test, thereby to generate a test pattern signal. By applying individual data to each waveform control part instead of test pattern data, respective individual data can be written simultaneously in the semiconductor devices under test.

1 Claim, 3 Drawing Sheets

SEMICONDUCTOR DEVICE TESTER

TECHNICAL FIELD

The present invention relates to a semiconductor device testing apparatus in which, in case of testing a plurality of semiconductor devices to be tested at the same time, individual data thereof that are different in their contents from one another can be written simultaneously.

BACKGROUND ART

Non-volatile memories called, for example, flash memories or the like have their individual data stored therein such as, for example, the name of their manufacturer, the model number of product, the manufacture number and the like, and then are shipped or forwarded as products. A timing of making an individual data store in each semiconductor device is often on the way of inspection for a semiconductor device after it is transferred from a manufacture line to an inspection line, and there are many cases that the individual data is written in each semiconductor device on the way of inspection.

FIG. 2 shows a rough construction of a prior art semiconductor device testing apparatus in which individual data of semiconductor devices can be written therein. Testing of a semiconductor device, particularly, a memory thereof is performed in such manner that a predetermined test pattern is stored in a memory under test, the test pattern stored in the memory is read out thereof, the read-out data and an expected value are compared, and when the read-out data disagrees with the expected value, a decision is rendered that a failure cell exists in a memory cell at the address where the disagreement therebetween occurs. Also, in case of testing a non-volatile memory, testing therefor is performed in a similar manner.

In the semiconductor device testing apparatus shown in FIG. 2, only a construction thereof that a test pattern is written in semiconductor devices DUT1–DUTn under test is shown. That is, a timing of the rise or leading edge and a timing of the fall or trailing edge of a test pattern signal to be applied to the semiconductor devices DUT1–DUTn under test are stored in a timing data generator 11, these timings being freely set in advance by a user, and the timing data are sent to a timing generation part 15. In the timing generation part 15 are generated a set pulse SP and a reset pulse RP each being set to be generated at a timing delayed by a predetermined delay time from the initial phase position of a test cycle in accordance with the timing data and a logical value of pattern data sent from a pattern data generator 12.

The set pulse SP and the reset pulse RP outputted from the timing generation part 15 are branched at branch points J1 and J2 in correspondence to the number of the semiconductor devices DUT1–DUTn under test. The branched set pulses and reset pulses are applied to waveform generation parts 18A–18N through variable delay elements 17 inserted in respective branched paths for phase matching, respectively.

Each of the waveform generation parts 18A–18N consists of a S-R flip-flop to the set terminal S of which is applied the set pulse SP thereby to control a timing of the leading edge of the test pattern signal. Also, the reset pulse RP is applied to the reset terminal R of the S-R flip-flop thereby to control a timing of the trailing edge of the test pattern signal. Further, a waveform control part 15A is a control part for controlling whether to generate test pattern signals having, for example, NRZ waveforms or RZ waveforms or other waveform modes from the waveform generation parts 18A–18N, respectively. The waveform modes are previously set in the waveform control part 15A prior to the start of testing.

The test pattern signals generated from the waveform generation parts 18A–18N are applied to corresponding pins of the semiconductor devices DUT1–DUTn under test through respective drivers 19A–19N, respectively. FIG. 2 shows the construction that the test pattern signals are applied to one of pins of the respective semiconductor devices DUT1–DUTn under test. Accordingly, in practice, the construction shown in FIG. 2 is provided by the same numbers as that of pins of each of the semiconductor devices DUT1–DUTn under test.

Here, there will be described an additional explanation as to the construction of the timing generation part 15. The timing generation part 15 comprises: the waveform control part 15A for generating a set signal SET and a reset signal RST on the basis of pattern data supplied from the pattern data generator 12 and a waveform mode previously set; an integer delay generation part 15B for generating a delay time corresponding to as much as an integer times a period of a reference clock REFCLK in timing data supplied from the timing data generator 11; a fraction delay data generation part 15C for generating a delay data corresponding to as much as a fraction shorter than a period of a reference clock REFCLK in timing data supplied from the timing data generator 11; and a pair of fraction delay generation parts 15D and 15E for giving a fraction delay time to a set pulse SP in accordance with a fraction delay data generated in the fraction delay data generation part 15C.

The fraction delay data generation part 15C applies a start signal and a fraction delay data to the fraction delay data generation part 15C at a timing that a delay time corresponding to an integer times a period of the reference clock REFCLK generated in the integer delay generation part 15B has passed, and the waveform control part 15A outputs a set signal SET in synchronism with the start signal. If the set signal SET should be a logical "1", for example, that indicates the rise of a test pattern signal, the fraction delay data generation part 15C sends a fraction delay data that defines a timing of the rise to the fraction delay generation part 15D.

In addition, if a reset signal RST being outputted from the waveform control part 15A should be a logical "1" that indicates the fall of a test pattern signal, the fraction delay data generation part 15C sends a fraction delay data to the fraction delay generation part 15E on the side of the fall.

In such manner, a timing of the rise of and a timing of the fall of a test pattern signal are defined, and this test pattern signal is applied in common to pins of all of the semiconductor devices DUT1–DUTn under test.

Next, the operation of writing data individually in each of the semiconductor devices DUT1–DUTn under test will be described. Individual data to be written individually in each of the semiconductor devices DUT1–DUTn under test is stored in an individual data storage part 13. In case of writing individual data, a multiplexer 14 is changed over such that its contact is connected to its terminal B, and the individual data is inputted into the timing generation part 15 in place of pattern data.

The individual data to be applied to each of the semiconductor devices DUT1–DUTn under test is composed of a series of one bit data as to each input pin, and this series of one bit data is prepared by a plurality of series for a plurality of pins thereby to form a parallel data representing a letter, a character, a sign, a symbol or the like. Like the pattern data, a set pulse and a reset pulse are applied to each of the waveform generation parts 18A–18N in accordance with a combination of logical "1" and logical "0" of the parallel data. In each of the waveform generation parts 18A–18N, a waveform of logical "1" or logical "0" is generated, and a code representing a letter or character or a code representing a sign or symbol is applied to each of pins of the semiconductor devices DUT1–DUTn under test so that data is written in each of the semiconductor devices DUT1–DUTn under test.

In case of writing data, in the prior art, a write-enable signal /WE is applied to one of the semiconductor devices DUT1–DUTn under test, and individual data (the name of maker, the name of device, serial number, and the like) corresponding to this one semiconductor device under test to which the write-enable signal /WE is applied, is written to the one semiconductor device under test. Such writing operation is carried out once for each of the semiconductor devices under test.

As discussed above, in the prior art semiconductor device testing apparatus, since a test pattern signal to be applied to the semiconductor devices DUT1–DUTn under test is distributed at the branch points J1 and J2, only the same test pattern signal can be applied to all of the semiconductor devices DUT1–DUTn under test on viewing at each moment.

In order to write respective individual data prepared in the individual data storage part 13 in the corresponding semiconductor devices DUT1–DUTn under test separately, it is necessary to apply a write-enable signal /WE separately to respective write-enable terminals of the semiconductor devices DUT1–DUTn under test, to read out the respective individual data prepared in the individual data storage part 13 one for each semiconductor device, and to write the read-out individual data in the semiconductor device under test selected by the write-enable signal /WE.

Consequently, it is required that the respective individual data must be written in the plural semiconductor devices DUT1–DUTn under test one individual data for one semiconductor device under test at a time. In case the respective individual data are written in the respective semiconductor devices DUT1–DUTn under test one individual data for one semiconductor device under test at a time, a time T required to write all of the individual data is as much as a write time t for one semiconductor device times the number N of the semiconductor devices, namely, T=t×N. Accordingly, the more the number N is increased, the more the time of writing the respective individual data is long. In the present status, there are many cases that N is equal to 64, namely, N=64.

As one method for removing such disadvantage, there is already known an invention disclosed in Japanese Patent Application Unexamined Publication No. 2002-083499 (JP, 2002-083499, A). The method disclosed in this Japanese Patent Application Unexamined Publication is characterized in that, as shown in FIG. 3, all of an individual data storage part 13; a multiplexer 14; and a timing generation part 15 comprising a waveform control part 15A, an integer delay generation part 15B and a fraction delay data generation part 15C is prepared by the number M of N times K (M=N×K) where N is the number of semiconductor devices DUT1–DUTn under test and K is the number of pins of each of the semiconductor devices DUT1–DUTn under test.

With the construction as stated above, when the individual data storage parts 13 are selected by switching the multiplexers 14 to connect their contacts with their terminals B, respective individual data can be applied to the corresponding semiconductor devices DUT1–DUTn under test from the individual data storage parts 13 at one time.

However, according to the construction shown in FIG. 3, the number M of the individual data storage part 13; the multiplexer 14; and the timing generation part 15 is equal to the product M of the number N of the semiconductor devices under test and the number K of pins of each of the semiconductor devices under test, namely, M=N×K, which results in a disadvantage that the scale of circuitry is much enlarged. By way of example, if N=64 and K=20, M comes to 1280. In addition, the power consumption is increased as the scale of circuitry is enlarged, and the generation of heat is also increased therewith. As a result, it is necessary to prepare a cooling means, which results in a disadvantage that the cost is higher.

It is an object of the present invention to provide a semiconductor device testing apparatus in which respective individual data can be written in corresponding semiconductor devices under test at one time with the avoidance of excessive enlargement in the scale of circuitry.

DISCLOSURE OF THE INVENTION

The present invention is constructed by: a pattern data generator that outputs test pattern data for defining a logical value of a test pattern to be applied to a semiconductor device under test;

a timing data generator that outputs timing data for defining timings of the rise and the fall of a test pattern signal to be applied to a semiconductor device under test;

integer delay generation parts that are provided, in case the number of the semiconductor devices under test is N and the number of pins of each semiconductor device under test is K, by the same number as that K of pins of each semiconductor device under test, and that generates a delay time corresponding to an integer times a period of a reference clock in timing data outputted from the timing data generator to give a delay time corresponding to that integer times the period of the reference clock to a test pattern signal to be applied to each of pins of each semiconductor device under test;

fraction delay data generation parts that are provided in correspondence to the respective integer delay generation parts of K, each having a start signal supplied from the corresponding one integer delay generation part at a timing that the delay time generated by each integer delay generation part has passed, and each outputting fraction delay data of the rise and the fall of a test pattern signal in synchronism with the start signal;

waveform control parts that are provided by the same number as that N of the semiconductor devices under test for each of the fraction delay data generation parts of K, and that supply respective timing pulses generated therefrom in accordance with fraction data outputted respectively from the corresponding fraction delay data generation parts to pins having the same attribute of all of the semiconductor devices under test as set pulses and reset pulses in accordance with test pattern data outputted from the test pattern data generator and a set waveform mode;

waveform generation parts that generate test pattern signals respectively in accordance with the set pulses and the reset pulses outputted from the waveform control parts respectively; individual data storage parts that are provided in correspondence to the respective waveform control parts, and that store therein individual data to be written in the corresponding semiconductor devices under test; and multiplexers that apply either one of the individual data stored in the individual data storage parts or test pattern data outputted from the pattern data generator. A pair of the integer delay generation part and the fraction delay data generation part may be provided by the same number as that K of pins of each of the semiconductor devices under test. Timing pulses generated respectively from the fraction delay data generation parts of K are distributed to the waveform control parts the number of which corresponds to the number N of the semiconductor devices under test, and test pattern signals to be applied to pins having the same attribute or property of all of the semiconductor devices under test respectively are formed by use of set pulses and reset pulses generated in the waveform control parts respectively. If an individual data is applied to each of the waveform control parts in place of the test pattern data, individual data having different specifications from one another can be written in a plurality of semiconductor devices under test at one time.

BEST MODE FOR CARRYING OUT THE INVENTION

Figure 1:
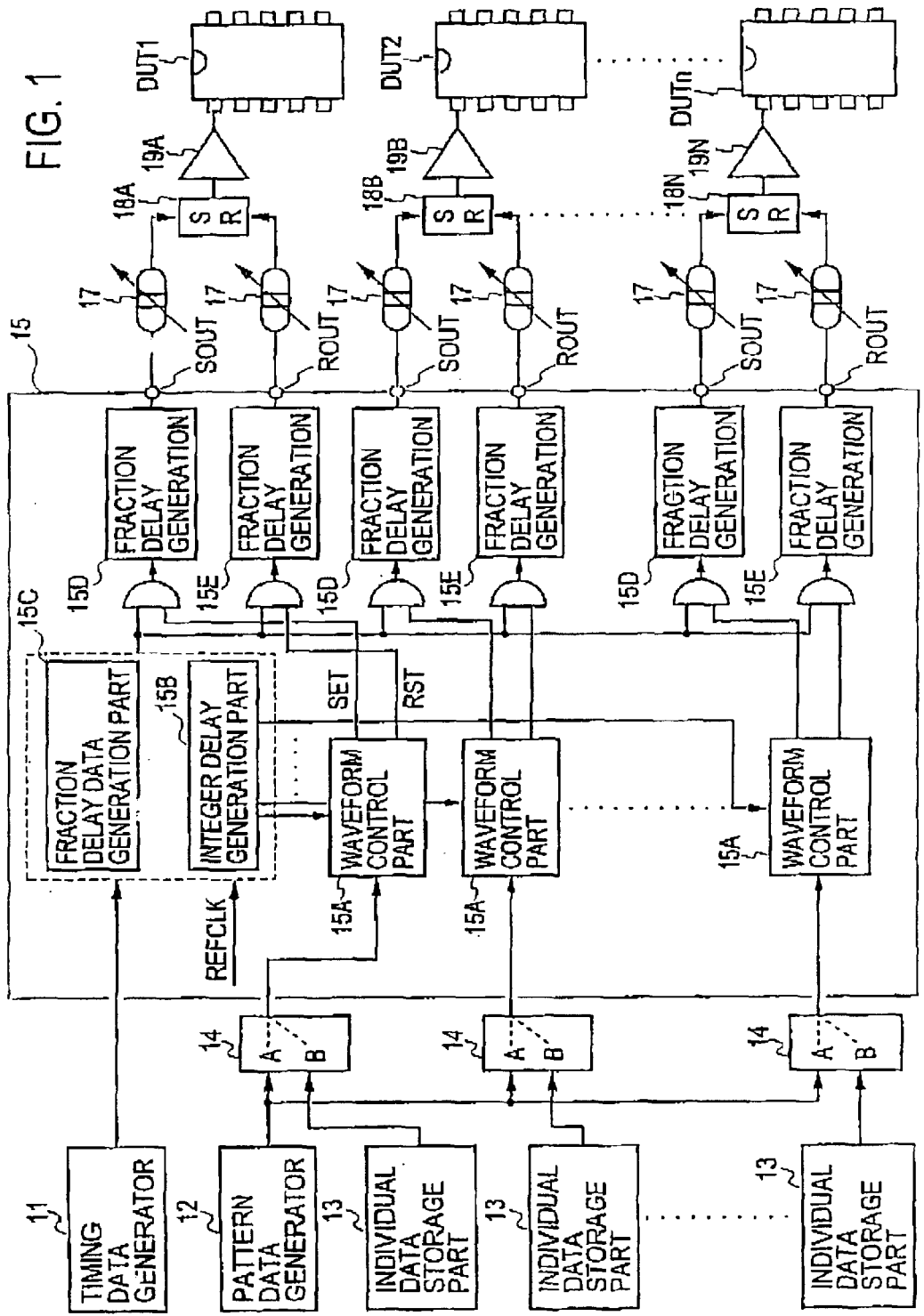
FIG. 1 is a diagram for explaining an embodiment of the present invention.
Figure 2:
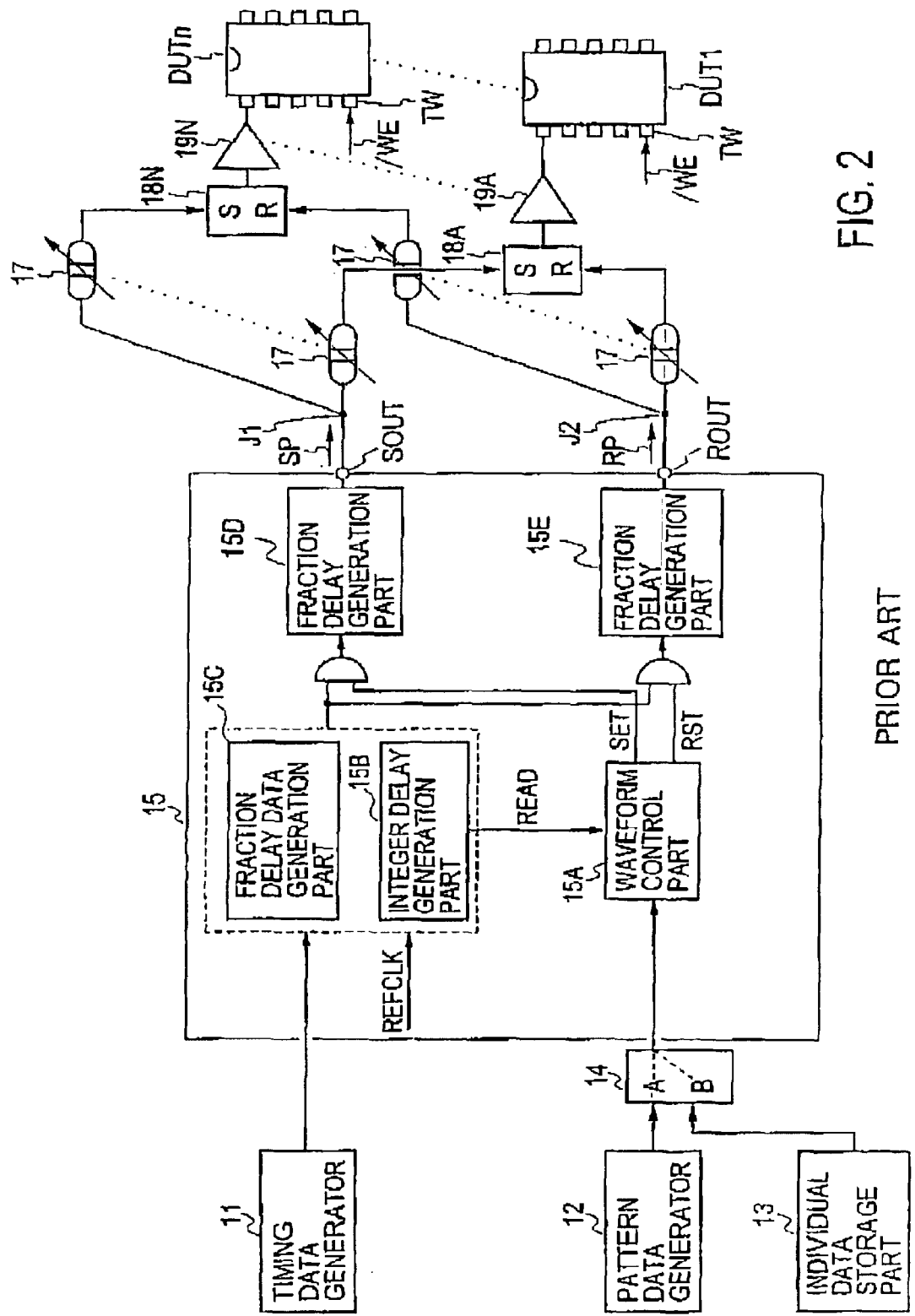
FIG. 2 is a diagram for explaining a prior art.

Now, a mode of carrying out the present invention will be described with reference to an embodiment thereof shown in FIG. 1. In FIG. 1, elements and portions corresponding to those shown in FIGS. 2 and 3 will be denoted by the same reference numbers or characters attached thereto.

The present invention is characterized in that a timing generation part 15 is constituted by pairs of integer delay generation parts 15B and fraction delay data generation parts 15C provided therein, the number of pairs being equal to the number of pins of each of semiconductor devices DUT1–DUTn under test, and a set of an individual data storage part 13, a multiplexer 14, a waveform control part 15A, and fraction delay generation parts 15D and 15E provided therein, the number of sets being equal to the product of the number N of the semiconductor devices DUT1–DUTn under test and the number K of pins of each of the semiconductor devices DUT1–DUTn under test. In the embodiment shown in FIG. 1, the timing generator 15 is illustrated such that it applies a test pattern signal and an individual data only to each of representative pins of the semiconductor devices DUT1–DUTn under test. In practice, the illustrated timing generator 15 is provided by the same number as that N of the semiconductor devices DUT1–DUTn under test.

With the construction according to the present invention, timings of the rise and the fall of test pattern signals and individual data to be applied to respective pins of all of the semiconductor devices DUT1–DUTn under test are controlled in common by the integer delay generation parts 15B and the fraction delay data generation parts 15C that are provided in correspondence to the attributes or properties of the pins, and hence the test pattern signals and the respective individual data are applied to the same pins of the semiconductor devices DUT1–DUTn under test at the same timings, respectively.

In addition, a set of the individual data storage part 13, the multiplexer 14, the waveform control part 15A, and the fraction delay generation parts 15D and 15E is provided in correspondence to the pins of each of the semiconductor devices DUT1–DUTn under test. Accordingly, in this embodiment, in each of the individual data storage parts 13 are stored a series of individual data each being one bit to be written for each pin of the corresponding one of the semiconductor devices DUT1–DUTn under test. The series of individual data each being one bit in each of the individual data storage parts 13 is applied to each of the pins of the semiconductor devices DUT1–DUTn under test simultaneously and individually so that all of the pins of the semiconductor devices DUT1–DUTn under test have its series of individual data each being one bit separately applied thereto at the same time from the corresponding individual data storage parts 13. As a result, it is possible to write separate individual data in all of the semiconductor devices DUT1–DUTn under test at one time.

Figure 3:
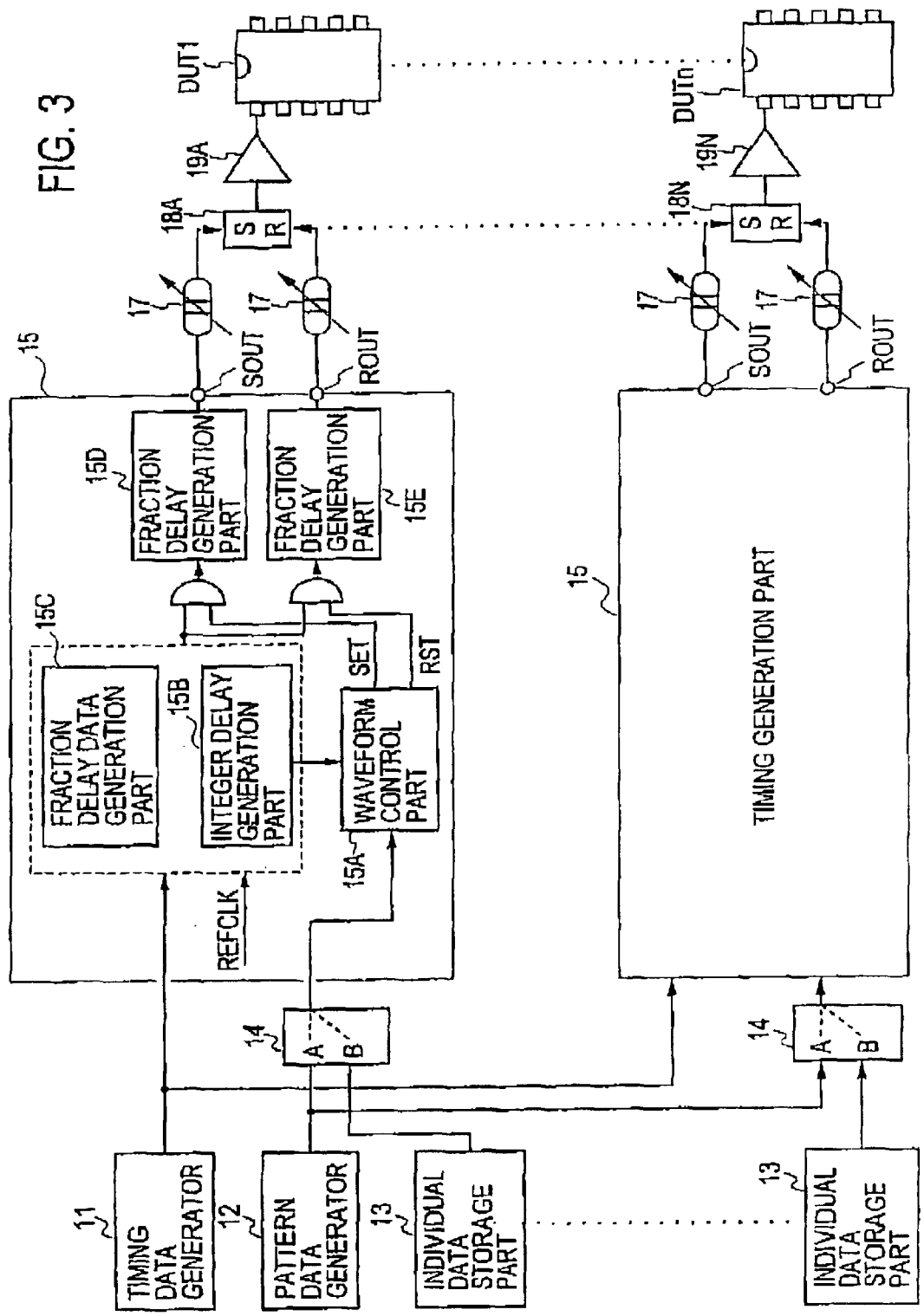
FIG. 3 is a diagram for explaining another prior art.

As compared with the prior art shown in FIG. 3, in the prior art shown in FIG. 3, it is configured such that the timing generation part 15 inclusive of the integer delay generation part 15B and the fraction delay data generation part 15C is provided by the product N×K of the number N of the semiconductor devices DUT1–DUTn under test and the number K of pins of each of the semiconductor devices under test, and therefore, the number of the integer delay generation part 15B and the fraction delay data generation part 15C is larger by (N−1)×K as compared with the present invention. For this reason, it is comprehended that the construction shown in FIG. 3 has a drawback that it needs high cost.

Availability In Industrial Application

As described above, the semiconductor device testing apparatus according to the present invention can be effectively used in testing semiconductor devices such as non-volatile memories in which separate individual data must be written one device by one device.

What is claimed is:

1. A semiconductor device testing apparatus comprising:
a pattern data generator that outputs test pattern data for defining a logical value of a test pattern to be applied to a semiconductor device under test;
a timing data generator that outputs timing data for defining timings of the rise and the fall of a test pattern signal to be applied to a semiconductor device under test;
integer delay generation parts that are provided, in case the number of the semiconductor devices under test is N and the number of pins of each semiconductor device under test is K, by the same number as that K of pins of each semiconductor device under test, and that generates a delay time corresponding to an integer times a period of a reference clock in timing data outputted from the timing data generator to give a delay time corresponding to that integer times the period of the reference clock to a test pattern signal to be applied to each of pins of each semiconductor device under test;
fraction delay data generation parts that are provided in correspondence to the respective integer delay generation parts of K, each having a start signal supplied from the corresponding one integer delay generation part at a timing that the delay time generated by each integer delay generation part has passed, and each outputting fraction delay data of the rise and the fall of a test pattern signal in synchronism with the start signal;
waveform control parts that are provided by the same number as that N of the semiconductor devices under test for each of the fraction delay data generation parts of K, and that supply respective timing pulses generated therefrom in accordance with fraction data outputted respectively from the corresponding fraction delay data generation parts to pins having the same attribute of all of the semiconductor devices under test as set pulses and reset pulses in accordance with test pattern data outputted from the test pattern data generator and a set waveform mode;

waveform generation parts that generate test pattern signals respectively in accordance with the set pulses and the reset pulses outputted from the waveform control parts respectively;

individual data storage parts that are provided in correspondence to the respective waveform control parts, and that store therein individual data to be written in the corresponding semiconductor devices under test; and multiplexers that apply either one of the individual data stored in the individual data storage parts or test pattern data outputted from the pattern data generator.

* * * * *